United States Patent
Wiesmann et al.

(10) Patent No.: US 6,794,339 B2
(45) Date of Patent: Sep. 21, 2004

(54) SYNTHESIS OF $YBA_2CU_3O_7$ USING SUB-ATMOSPHERIC PROCESSING

(75) Inventors: Harold Wiesmann, Stony Brook, NY (US); Vyacheslav Solovyov, Rocky Point, NY (US)

(73) Assignee: Brookhaven Science Associates, Upton, NY (US)

( * ) Notice: Subject to any disclaimer, the term of this patent is extended or adjusted under 35 U.S.C. 154(b) by 463 days.

(21) Appl. No.: 09/950,888

(22) Filed: Sep. 12, 2001

(65) Prior Publication Data

US 2003/0050195 A1 Mar. 13, 2003

(51) Int. Cl.[7] .............................. C23C 4/04; C23C 30/00
(52) U.S. Cl. ......................... 505/470; 505/500; 427/62; 427/380; 427/350
(58) Field of Search ................................. 505/470, 500, 505/730, 461; 427/62, 380, 350; 29/599

(56) References Cited

U.S. PATENT DOCUMENTS

| | | | | |
|---|---|---|---|---|
| 4,959,346 A | * | 9/1990 | Mogro-Campero et al. | 505/235 |
| 5,231,074 A | * | 7/1993 | Cima et al. | 505/434 |
| 5,306,698 A | | 4/1994 | Ahn et al. | 505/475 |
| 5,308,800 A | | 5/1994 | Wehrle et al. | 505/400 |
| 5,661,114 A | | 8/1997 | Otto et al. | 505/501 |
| 5,741,377 A | | 4/1998 | Goyal et al. | 148/512 |
| 5,850,098 A | | 12/1998 | Butler et al. | 257/467 |
| 5,854,587 A | | 12/1998 | Horwitz et al. | 338/22 |
| 5,856,277 A | | 1/1999 | Chen et al. | 505/452 |
| 6,172,009 B1 | * | 1/2001 | Smith et al. | 505/473 |
| 6,673,387 B1 | * | 1/2004 | Zhang et al. | 427/62 |

OTHER PUBLICATIONS

Solovyoy, et al., "Ex–Situ Post–deposition Processing for Large Area $Yba_2 CU_3 O_7$ Films and Coated Tapes" IEEE Transactions on Applied Superconductivity, vol. 11, No. 1, Mar. 2001.

Solovyoy, et al., "The Effects of HF Partial Pressure and Pressure Gradients of YBCO Growth in the $BaF_2$ Process", 2001 International Workshop on Superconductivity, Honolulu, Hawaii, Jun. 2001.

M. Suenaga; "Growth Kinetics and Microstructures of YBCO fabricated by the $BaF_2$ Process"; Presentation at American Superconductor in Westborough, MA, on Sep. 6, 2000.

M. Suenaga et al. "Practical Conductor Development for Electric Power Systems Utilizing High $T_c$ Oxides: AC Loss Measurements"; Department of Energy Annual Review, Superconductivity Program for Electric Systems, presentation and report, Jul. 17–19, 2000.

* cited by examiner

Primary Examiner—Mark Kopec
(74) Attorney, Agent, or Firm—Margaret C. Bogosian

(57) ABSTRACT

The present invention is a method of forming thick films of crystalline $YBa_2Cu_3O_7$ that includes forming a precursor film comprising barium fluoride ($BaF_2$), yttrium (Y) and copper (Cu). The precursor film is heat-treated at a temperature above 500° C. in the presence of oxygen, nitrogen and water vapor at sub-atmospheric pressure to form a crystalline structure. The crystalline structure is then annealed at about 500° C. in the presence of oxygen to form the crystalline $YBa_2Cu_3O_7$ film. The $YBa_2Cu_3O_7$ film formed by this method has a resistivity of from about 100 to about 600 $\mu$Ohm-cm at room temperature and a critical current density measured at 77 K in a magnetic field of 1 Tesla of about $1.0 \times 10^5$ Ampere per square centimeter (0.1 $MA/cm^2$) or greater.

26 Claims, 8 Drawing Sheets

SYNTHESIS OF YBA$_2$CU$_3$O$_7$ USING SUB-ATMOSPHERIC PROCESSING

This invention was made with Government support under contract number DE-AC02-98CH10886, awarded by the U.S. Department of Energy. The Government has certain rights in the invention.

BACKGROUND OF INVENTION

The present invention relates to methods for making high-performance superconducting materials. In particular, the present invention relates to a method for making films of biaxially textured YBa$_2$Cu$_3$O$_7$ ("YBCO") on flexible substrates.

The recent discovery of a broad class of materials such as YBCO with superconducting transition temperatures exceeding the boiling point of liquid nitrogen (77 K) has resulted in widespread interest in developing methods for making these materials and finding new applications for them. YBCO is useful for the fabrication of high frequency filters, SQUIDS and other electronic devices. In addition it has promise as a conductor for use in electric motors, electrical cable, transformers, fault current limiters and various electrical utility devices. One of the most promising applications of high critical temperature superconductors is for use in the fabrication of high field magnets. The fabrication of magnets requires the availability of flexible superconductors, especially YBCO superconducting tapes. YBCO superconducting tapes are generally fabricated by growing an YBCO film on a flexible substrate. The most desirable YBCO films for applications in flexible tapes have a thickness of about 1 micron or greater. The YBCO films must be relatively free of impurities and various structural defects, such as high angle grain boundaries, so that they are capable of carrying high critical current densities, $J_c$. The flexible superconducting tapes must also be fabricated economically.

Many different techniques for fabricating YBCO films are described in the scientific literature. These methods include, but are not limited to, RF sputtering, DC sputtering, magnetron sputtering, thermal evaporation, electron beam evaporation, pulsed laser deposition (PLD), spin coating, dip coating, metal organic deposition (MOD) and metal organic chemical vapor deposition (MOCVD).

One of the methods for making textured crystalline YBCO is the so-called "BaF$_2$ post annealing process". This process consists of first preparing a precursor film consisting of a mixture of BaF$_2$, Y and Cu deposited on a supporting substrate. To transform the precursor film into a crystalline YBCO film, the precursor film is heat-treated in a humidified, low oxygen partial pressure atmosphere. The BaF$_2$ process as currently practiced heat-treats the films at atmospheric pressure.

Another method for making crystalline YBCO films on a substrate involves coating a substrate with a solution and thermally processing the resulting composite. This technique is referred to as metal organic deposition (MOD). The first step in the MOD process is to prepare a liquid solution, for example a mixture of Y, Ba, and Cu trifluoroacetates in methanol. Substrates are coated with the solution and allowed to dry forming a precursor film. The organic components of the precursor film are 'burned off' at about 400° C. The film-substrate composite is next heat-treated in a humidified, low oxygen partial pressure atmosphere converting the precursor film to a crystalline YBCO film. The MOD technique as currently practiced heat-treats the films at atmospheric pressure.

Both of these techniques, as described in the literature, require heat-treating the precursor films at atmospheric pressure, at temperatures above about 600° C. Both techniques also incorporate fluorine (F) in the precursor film.

Unfortunately both of these techniques for making crystalline YBCO films have drawbacks. One drawback is that the YBCO film growth rate is low. In experiments performed at Brookhaven National Laboratory (BNL), YBCO films 5 microns thick were grown at growth rates of about 0.7 Angstroms per second. These films were synthesized using an atmospheric pressure heat-treating gas composed of 25 Torr water vapor, 100 milliTorr oxygen and balance nitrogen. The heat-treating temperature was 735° C. and the total gas flow was 100 standard cubic centimeters per minute (sccm). In order to achieve higher growth rates it was necessary to substantially increase the water vapor pressure. YBCO films 5 microns thick were grown at BNL at rates of up to 2.5 Angstroms per second using a heat-treating temperature of 735° C., 100 milliTorr of oxygen and a total gas flow of 100 sccm. These YBCO films were c-axis oriented and had high $J_c$ greater than $1\times10^5$ Ampere per square centimeter (0.1 MA/cm$^2$), but extremely high water vapor partial pressures, about 150 Torr, were required during the heat-treating step. This work is described in the BNL article by Solovyov et al. "High Rate Deposition of 5 um Thick YBa$_2$Cu$_3$O$_7$ Films Using the BaF$_2$ Ex-Situ Post Annealing Process", *IEEE Transactions on Applied Superconductivity*, 9 (2), June 1999, incorporated by reference herein. Such extremely high water vapor pressures can have a corrosive effect on the supporting substrate, processing furnace 10 and possibly the YBCO film itself. In addition the equipment required for delivering the humidified gas to the heat-treating furnace becomes more complex and costly. Finally, it is difficult to grow large area films with uniform properties using atmospheric pressure heat-treating.

An experimental vacuum-processing apparatus was constructed for heat-treating precursor films at sub-atmospheric pressures over a temperature range of room temperature to 1000° C. The water vapor, oxygen and carrier gas partial pressures present in the apparatus could be independently controlled during heat-treatment. It was discovered that during heat-treatment the water vapor partial pressure can be decreased by a factor of more than 1000 and the total processing gas pressure decreased by a factor of over a 100 and films with high $J_c$ can be grown at rates exceeding 5 Angstroms per second (Å/sec.). It was also discovered that the growth rate of crystalline YBCO films was inversely proportional to the to the total gas pressure, $P_T$, in the vacuum-processing apparatus. Decreasing the total gas pressure increased the YBCO growth rate.

An additional benefit is a decrease in the residence time of the gasses when heat-treating at sub-atmospheric pressures while using the same gas flow as in an atmospheric pressure processing chamber. A decrease in residence time allows impurity gasses and gaseous by-products to be swept out of the sub-atmospheric heat-treating chamber much more quickly. This results in YBCO films of higher purity as compared to YBCO films synthesized at atmospheric pressure. In addition the quantity of oxygen and carrier gas can be substantially reduced using sub-atmospheric heat-treating as compared to atmospheric heat-treating making sub-atmospheric heat-treating more economical.

U.S. Pat. No. 5,306,698 to Ahn et al. discloses a method for producing a high transition temperature superconductor of Tl$_2$Ca$_2$Ba$_2$Cu$_3$ oxide from a Tl$_2$Ca$_2$Ba$_2$Cu$_3$ cation composition. Ahn et al. use an annealing step in a reduced oxygen atmosphere to convert compounds containing thallium, calcium, barium and copper to a Tl-2223 superconducting phase or to convert an oxide having the nominal composition $Tl_2Ca_2Ba_2Cu_3O_x$ to a crystalline Tl-2223 phase.

U.S. Pat. No. 5,308,800 to Wehrle et al. discloses an apparatus and method for fabricating textured pseudo-single crystal bulk superconducting materials. Wehrle et al. produce these bulk superconducting materials by melt-texturing techniques using a steep temperature gradient furnace at elevated pressures of from 10 to 20 atmospheres. Wehrle et al. disclose that highly textured superconductor materials have been prepared which exhibit superconductive properties at higher temperatures than previously achievable.

U.S. Pat. No. 5,661,114 to Otto et al. discloses a method of preparing BSCCO oxide superconductor articles using a low pressure, low temperature annealing process to increase the critical current density. Otto et al. disclose that the process conditions are adjusted so that the article is partially melted and a liquid phase co-exists with the desired oxide superconductor phase. Otto et al. also disclose that the oxide superconductor articles can be formed from the YBCO-123 family.

U.S. Pat. No. 5,741,377 to Goyal et al. discloses a method for preparing a biaxially textured alloy article by depositing an alloying agent onto a substrate to form a laminate and heating the laminate. Goyal et al. also disclose c-axis oriented, biaxially textured, superconducting YBCO films.

U.S. Pat. No. 5,850,098 to Butler et al. discloses a thermal detector that includes a transducer layer of amorphous semiconducting yttrium barium copper oxide. Butler et al. also disclose that thick layers of $YBa_2Cu_3O_7$ can be annealed at 500° C. in a vacuum to crystallize the film.

U.S. Pat. No. 5,854,587 to Horwitz et al. discloses rare earth manganite thin films preferably formed by pulsed laser deposition on a $Si_3N_4$ substrate in a vacuum chamber with a buffer layer of $CeO_2$ to help direct the manganite material to grow in the correct phase and optimum crystallographic orientation followed by annealing at a temperature in the range of 500° to 900° C. in oxygen or vacuum. However, Horwitz et al. only disclose manganite film structures.

U.S. Pat. No. 4,959,346 to Mogro-Campero et al. is directed to a composite comprised of Y—Ba—Cu—O superconductive film having a zero resistance transition temperature of at least 38 K. However, unlike the present invention, the precursor film of Mogro-Campero et al. is annealed at atmospheric pressure and not sub-atmospheric pressure.

U.S. Pat. No. 5,856,277 to Chen et al. discloses a method of manufacture of a textured layer of a high temperature superconductor, such as rare earth superconductors and a $YBa_2Cu_3O_{7-x}$(123-YBCO) superconductor on a substrate using a melt texturing process. Chen et al. also disclose a method that can be used to produce a film 0.1–1 $\mu$m thick by heating the films to temperatures of 950° to 990° C. at sub-atmospheric pressures.

U.S. Pat. No. 6,172,009 to Smith et. al. discloses a metal oxyfluoride on a substrate. The metal oxyfluorides of Smith et. al. are ternary compounds of a metal bound to oxygen and fluorine, e.g. $MO_xF_y$ or a mixture of $MO_xF_y$ and metal oxides and metal fluorides e.g. $MO_x$ and $MF_y$. Smith et. al. does not disclose the use of sub-atmospheric pressures nor do they teach the importance of the total absolute pressure of the processing gas, $P_T$.

The present invention overcomes the problems experienced by processes currently in use by carrying out the heat treatment of precursor films at sub-atmospheric pressures.

SUMMARY OF THE INVENTION

The present invention is a method of forming films of crystalline $YBa_2Cu_3O_7$ that includes forming a precursor film of barium fluoride ($BaF_2$), yttrium (Y) and copper (Cu) on a substrate that preferably includes $SrTiO_3$ or $CeO_2$. The precursor film is heat-treated at a temperature above about 500° C. and most preferably to about 735° C. in the presence of oxygen, water vapor and optionally a carrier gas, preferably nitrogen, at sub-atmospheric pressure to form a crystalline $YBa_2Cu_3O_{7-\delta}$ structure. The partial pressure of oxygen during the heat-treating of the precursor film is about 100 milliTorr. The heat-treating is accomplished over a period of from about 30 minutes to about 14 hours depending on the thickness of the starting precursor film and the desired growth rate. The crystalline structure is then annealed in the presence of oxygen at a temperature of from about 400° C. to about 600° C. to form a fully oxygenated crystalline $YBa_2Cu_3O_7$ film.

During the heat-treating step, the $YBa_2Cu_3O_7$ film grows at a rate of from about 1 to about 20 Angstroms per second as measured by the conductivity of the film. The thickness of the $YBa_2Cu_3O_7$ films produced by this method is from about 0.05 to about 5 microns, preferably from about 0.2 to about 3 microns.

The present invention provides high quality $YBa_2Cu_3O_7$ films that are more uniform and can be grown at relatively high growth rates using substantially reduced water vapor pressure and substantially reduced total pressure than films made by the methods that are currently being used.

BRIEF DESCRIPTION OF THE FIGURES

Other objects and many attendant features of this invention will be readily appreciated as the invention becomes better understood by reference to the following detailed description when considered in connection with the accompanying drawings wherein.

DETAILED DESCRIPTION OF THE INVENTION

Figure 1:
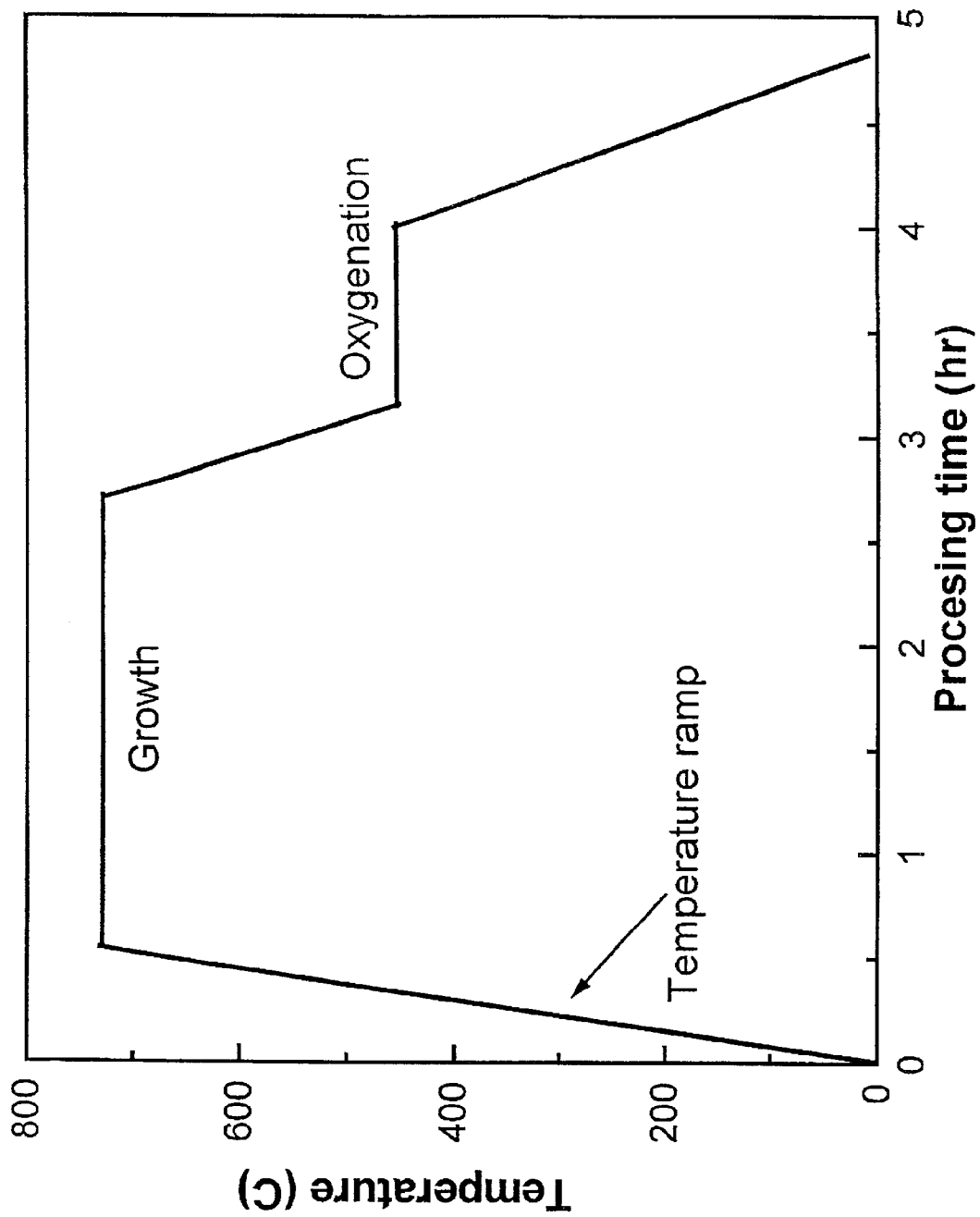
FIG. 1 is a graph representing the typical heat-treating and annealing cycle.

The present invention is a process for making thick films of biaxially textured $YBa_2Cu_3O_7$ (YBCO). The process begins by choosing a suitable biaxially textured substrate, preferably a metal such as nickel coated with an appropriate heteroepitaxial buffer layer such as cerium oxide. Stoichiometric YBCO precursor films consisting of a mixture of $BaF_2$, Y and Cu are then deposited onto the textured substrate. Electron beam vaporization is the preferred method used to deposit the Y and Cu and a heated crucible is preferably used to deposit the $BaF_2$. Theses precursor films are essentially a fine grained microcrystalline mixture comprising Y, Cu and $BaF_2$ and must be converted to crystalline biaxially textured $YBa_2Cu_3O_7$ films.

The so-called $BaF_2$ process was first described by Mankiewich et al. in two articles titled "Reproducible Technique For Fabrication Of Thin Films Of High Transition Temperature Superconductors," *Applied Physics Letter,* 51 (21), Nov. 23, 1987 and "High Critical-Current Density $Ba_2YCu_3O_7$ Thin Films Produced By Coevaporation of Y, Cu, and $BaF_2$," *Materials Research Society Symposium,* Vol. 99, 1988. These references are incorporated herein in their entirety. There have been a number of subsequent papers reporting the use of this process. A common trait in all of the $BaF_2$ processes disclosed in these references is that the total gas pressure used is greater than or equal to the atmospheric pressure, i.e. the total gas pressure is approximately zero psig or higher.

The Mankiewich et al. Process

When Mankiewich et al. began their work, $YBa_2Cu_3O_7$ films had been successfully produced using electron beam evaporation or sputtering methods. However, it was found that films made by coevaporation using a Ba metal source quickly degraded in the presence of moisture. Barium metal is easily oxidized and reacts quickly, developing a white, shaggy surface in a few minutes upon exposure to air. This greatly complicates the operation and maintenance of a vacuum deposition system. Therefore, these processes required extreme care and the resulting films were difficult to reproduce on a routine basis. In addition, the bulk material was found to be sensitive to environmental conditions, especially water, indicating that the films required special handling to ensure stability.

Mankiewich et al. knew that $YBa_2Cu_3O_7$ films made by the depositing of Ba were extremely sensitive to reaction with water. Substituting $BaF_2$ for Ba they found that the presence of water during the high temperature portion of the heat-treating cycle could greatly reduce the time necessary to convert the as-deposited films into the black superconducting phase. In the papers of Mankiewich et. al. it should be noted that the 'annealing' portion of their experiments is equivalent to the heat-treating phase of the experiments of the current invention. They found that the residual moisture in the tubing through which the oxygen passed during the high temperature portion of the 'annealing' cycle was sufficient to complete conversion of the precursor film to crystalline YBCO in 3 hours. When water was deliberately added to the oxygen stream by bubbling it through a room temperature water bath, the conversion time was reduced to as short as 15 minutes. The resulting films formed by Mankiewich et al. were dense, had critical temperatures as high as 91 K, and critical current densities as high as $10^6$ Ampere per square centimeter at 82 K using $SrTiO_3$ substrates.

In contrast to a coevaporation process that uses a Ba source, the $BaF_2$ source used in the Mankiewich et al. process is relatively inert, does not require special handling, and does not significantly contribute to out-gassing in the deposition system. Films made with $BaF_2$ survive direct immersion in water before annealing and there is no degradation after exposure of the annealed films to air. This is in sharp contrast to films made with Ba metal which dissolve in water in their pre-annealed state.

The Mankiewich et al. process forms high quality films of $YBa_2Cu_3O_7$ by coevaporation of Y, Cu, and $BaF_2$ and subsequent 'annealing' in oxygen. The addition of water vapor to the 'annealing' gas at high temperatures was found to greatly reduce the 'annealing' time and, thus the substrate interaction. Mankiewich et al. were able to routinely obtain transition temperatures (zero resistance) between 89–92 K on $SrTiO_3$ and cubic zirconia substrates. Using transmission electron microscopy, they found that on $SrTiO_3$ the superconducting grains have an epitaxial orientation with respect to the substrate. These films are optically dense and persistent current measurements in thin film rings demonstrated the absence of residual resistance in the superconducting state. The use of $BaF_2$ in the process, rather than the reactive Ba metal, resulted in the formation of unusually robust as-deposited and partially 'annealed' films. It was found that the films could be patterned by photolithography, exposed to room air indefinitely, or even immersed in water before 'annealing', without affecting the transition temperature.

The Mankiewich et al. process used a diffusion-pumped glass-bell-jar system evaporator with a base pressure before evaporation of $2\times10^{-6}$ Torr and an oxygen pressure during deposition of $1\times10^{-5}$ Torr. The substrate, preferably oriented $SrTiO_3$, was solvent cleaned and then blown dry with dry nitrogen before insertion in the evaporator. The substrate was held at room temperature and the $O_2$ pressure was held at $1\times10^{-5}$ Torr during deposition. For several tests, the substrate holder was heated to a nominal temperature of 550° C. and acceptable results were obtained.

Co-evaporating Y, Cu, and $BaF_2$ from separate sources formed the films on the substrate. The Y was heated in a 3-kW electron beam hearth and the $BaF_2$ and Cu were heated in separate tungsten resistive boats. The $BaF_2$ was in the form of 99.9% purity crystalline pieces. Electron diffraction studies of $BaF_2$ films evaporated from a similar source showed that the material vaporized and deposited as a molecule. The deposition rates for all three sources were controlled using feedback from quartz crystal monitors. Appropriate rates were determined by compositional depth profiling of as-deposited and annealed films using Auger analysis during ion milling, calibrated using bulk $YBa_2Cu_3O_7$ as a standard. Total indicated $BaF_2$ deposition thicknesses ranged from 1000 to 5000 Å.

Before 'annealing', Mankiewich et al. used Auger depth profiling to determine that the film contained substantial fluorine. This was consistent with their prior work that showed that $BaF_2$ evaporated in molecular form. After final 'annealing', this film showed only trace amounts (order of 0.1%) of fluorine, as determined by secondary ion mass spectroscopy using the implantation of a known dose of fluorine as a standard.

After deposition, the films were heat-treated to convert them from the semi-transparent, insulating phase to the black superconducting phase. A typical post-deposition annealing cycle in a tube furnace with flowing oxygen involved several hours at 800–920° C. followed by a slow ramp to 550° C. This temperature was held for 30 minutes to maximize oxygen uptake before continuing the cooling ramp to room temperate.

Sub-atmospheric Processing

The use of one atmosphere of pressure in a $BaF_2$ post annealing process presents a number of problems, both real and potential. For example, to be technologically useful the YBCO films must carry high currents. This requires films that are at least 1 micron thick and the films must be grown at reasonably fast rates. Recently at Brookhaven National Laboratory, Solovyov et al., said reference previously incorporated herein, demonstrated the growth of 5 micron thick films having excellent superconducting properties using the $BaF_2$ post annealing process at atmospheric pressure. These films were grown at rates of up to 2.5 Angstroms per second but unfortunately required extremely high water vapor partial pressures, on the order of 150 Torr. Such high water vapor pressures can have a deleterious effect on a metallic substrate, a buffer layer and a YBCO film especially at a typical heat-treating temperature of 735° C. For example metallic substrates become more susceptible to oxidation as the water vapor pressure is increased.

The present invention is a method of synthesizing $YBa_2Cu_3O_7$ (YBCO) using sub-atmospheric pressure processing to "grow" films of crystalline YBCO on suitable substrates. Especially interesting is the growth of bi-axially textured YBCO on flexible substrates. The process includes depositing near stoichiometric YBCO precursor films consisting of a mixture of $BaF_2$, Y and Cu onto a textured substrate. The substrate is usually a metal such as nickel coated with an appropriate heteroepitaxial buffer layer such as cerium oxide. Electron beam evaporation is used to deposit the Y and Cu and a heated crucible is used to deposit the $BaF_2$.

The precursor films are next heat-treated at subatmospheric pressures in a chamber containing an atmosphere comprising water vapor and oxygen partial pressure to form crystalline bi-axially-textured YBCO films. The heat-treating temperatures are generally in the range of from about 500° C. to about 1000° C. In one preferred embodiment, the heat-treating temperature is 735° C. After the heat-treating cycle is complete the chamber is then cooled to about 500° C. and the films are annealed in about 600 Torr of pure oxygen for about one-half hour resulting in high quality epitaxial YBCO films. A schematic of a typical heat-treating and annealing cycle for a 1 micron thick YBCO film is shown in FIG. 1.

It has been found that the preferred growth rate for c-oriented high critical current density YBCO films is from about 0.5 to about 10 Angstroms per second, preferably from about 1 to about 5 Angstroms per second, as measured by the conductivity of the film.

During heat-treatment the oxygen partial pressure and temperature are kept above the YBCO decomposition line as described in the paper by Feenstra et al. "Properties of Low Temperature, Low Oxygen Pressure Post-annealed $YBa_2Cu_3O_{7-x}$ Thin Films", *High $T_c$ Superconductor Thin Films*, 1992 Elsevier Science Publishers B.V. and incorporated by reference herein in its entirety. For a temperature of about 700° C. to about 800° C. the oxygen partial pressure should be above about 10 milliTorr and 100 milliTorr respectively. The oxygen stability data shown in Feenstra et al. was determined for YBCO grown at a total pressure of about one atmosphere. When utilizing sub-atmospheric processing an oxygen partial pressure of about 100 milliTorr was found to give good results. It is understood by those skilled in the art that the optimum oxygen partial pressure for a particular set of heat-treating conditions must be determined by experiment.

Prior to the present invention, the $BaF_2$ post annealing process was carried out at total gas pressures equal to atmospheric pressure. The present invention uses subatmospheric pressures for the first time to overcome problems encountered when the $BaF_2$ post annealing process is operated at atmospheric pressure.

Description of the Vacuum-Processing Apparatus

Figure 2:
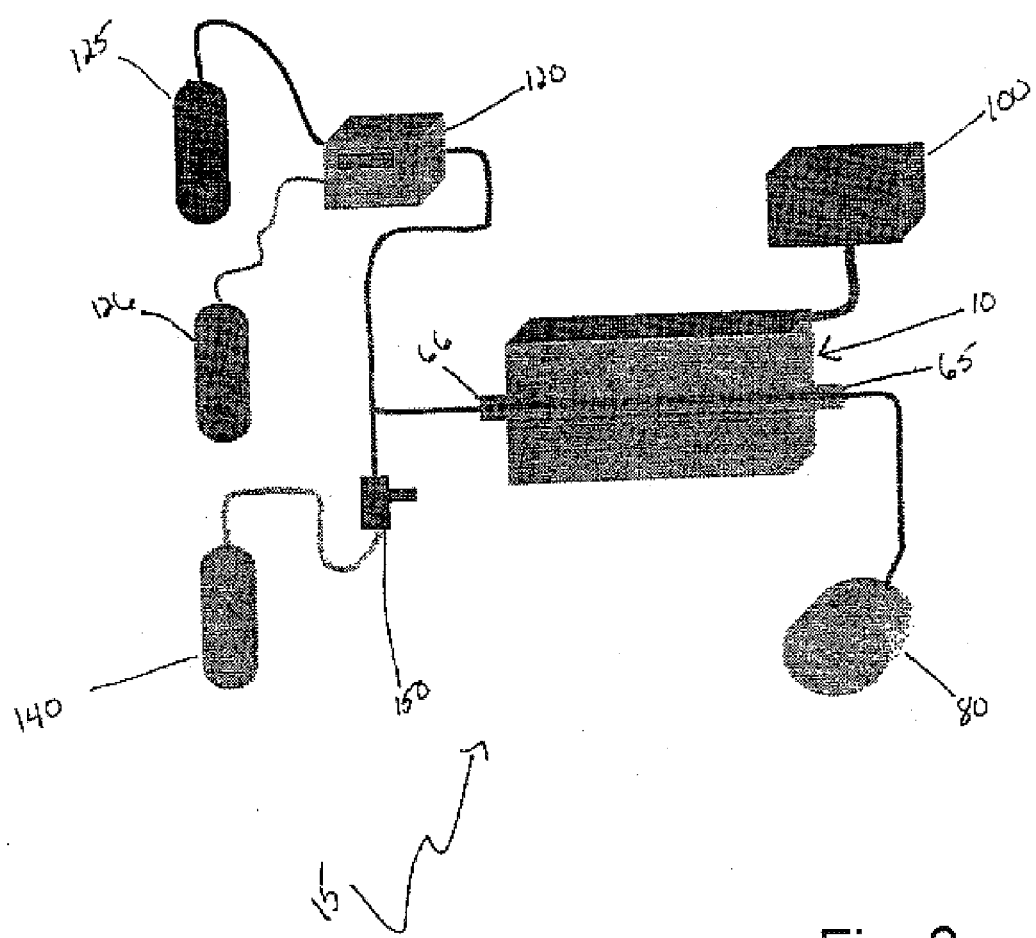
FIG. 2 is a schematic of the vacuum-processing apparatus.
Figure 3:
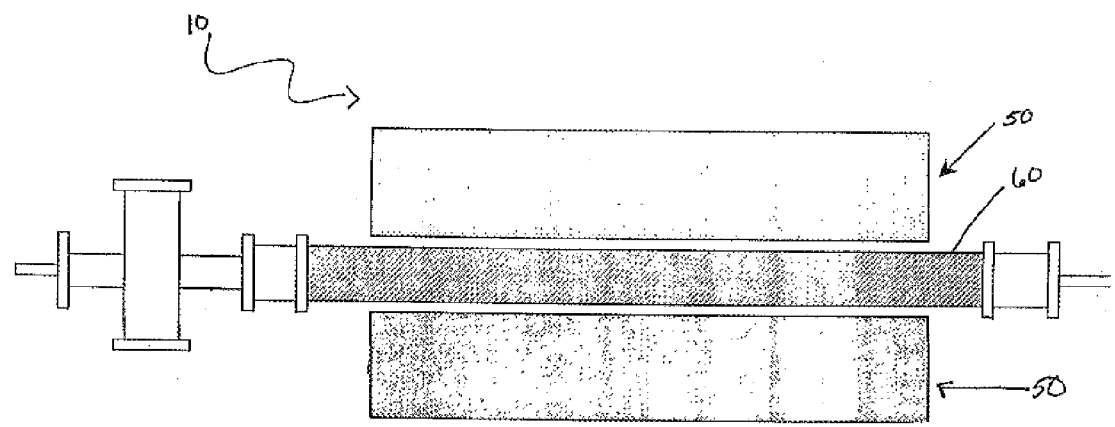
FIG. 3 is a detailed schematic of the oven and quartz tube.

A schematic diagram of the vacuum-processing apparatus 15 is shown in FIG. 2. FIG. 2 shows a vacuum-processing furnace 10, said vacuum-processing furnace 10 comprising an oven 50, said oven 50 enclosing a tube 60, said tube 60 preferably composed of quartz. Connected to the outlet 65 of said tube 60 is a pump 80 and connected to the inlet 66 is a gas manifold. The pump 80 is used to establish a total vacuum or partial vacuum in the quartz tube. A "temperature controller" 100 which monitors the oven 50 temperature using a thermocouple or other temperature-sensing device controls the oven temperature. Oxygen 125 and nitrogen 126 gas are admitted to the tube 60 using electronic mass flow controllers 120. Water vapor is extracted from a vessel 140 containing liquid water and the flow is controlled using a throttle valve 150. A more detailed schematic of the oven 50 and quartz tube 60 are shown in FIG. 3.

Figure 4:
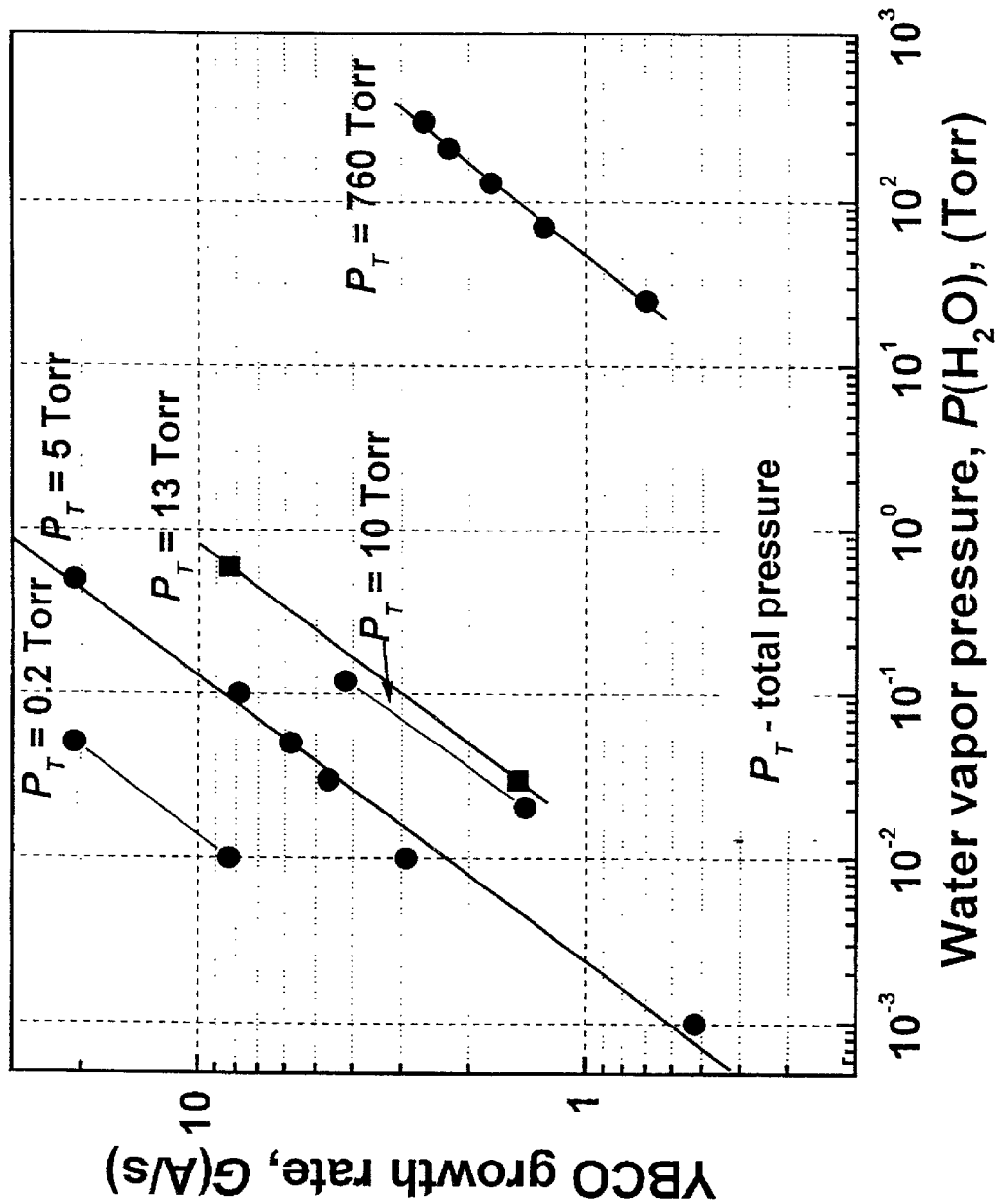
FIG. 4 is a graph of growth rate versus water vapor pressure comparing YBCO films grown at sub-atmospheric pressures to YBCO films grown at atmospheric pressure.

A series of seventeen individual experiments were performed at BNL as follows. Each experiment started with the deposition of a precursor film onto a single crystal $SrTiO_3$ substrate. Each precursor film consisted of a near stoichiometric mixture of $BaF_2$, Y and Cu. Electron beam evaporation was used to deposit the Y and Cu and a heated crucible was used to deposit the $BaF_2$. For each experiment the $SrTiO_3$ substrate was estimated to be at a temperature of about 100–200° C. during the deposition of the precursor film. Each precursor film was subsequently heat-treated at 735° C. in an atmosphere of water vapor, oxygen and nitrogen gas. The films were heat-treated until all of the precursor film was converted to crystalline YBCO as indicated by measurement of the electrical conductance of the film. For all seventeen of these experiments the oxygen partial pressure was in the range of about 40 to 125 milliTorr during the heat-treating cycle. Upon completion of the heat-treating cycle the furnace 10 was cooled to about 500° C. and the YBCO film was exposed to 600 Torr oxygen for about 1 hour in order to fully oxygenate the YBCO film. Twelve of the precursor films were heat-treated at subatmospheric pressure and five of the precursor films were heat-treated at atmospheric pressure. In FIG. 4 the YBCO growth rate, G, versus water vapor partial pressure is shown for all seventeen films. The tie-lines shown in FIG. 4 connect YBCO films grown at the same total pressure, $P_T$, but different water vapor partial pressures. Experiments were performed at absolute total pressures of 0.2, 5, 10, 13, and 760 Torr. The total pressure for each individual tie-line is listed at the top of the tie-line. FIG. 4 clearly demonstrates that accelerated YBCO growth rates are obtained at greatly reduced sub-atmospheric pressures. Especially note the large decrease in the required water vapor partial pressures. The relationship between YBCO growth rate, G, water vapor pressure, $p(H_2O)$ and total pressure, $P_T$, can expressed by the equation $$G = A[p(H_2O)]^{1/2}/P_T$$

where A is a constant. This equation clearly demonstrates the dependence of the YBCO growth rate on the total sub-atmospheric pressure, $P_T$, present during the heat-treating cycle.

It must be stressed that the data presented in FIG. 4 is applicable to the vacuum-processing apparatus 15 illustrated in FIG. 2. As will be shown by example changes in the geometry of the vacuum-processing apparatus 15 will affect the growth rate and properties of the resulting crystalline YBCO films.

EXAMPLE 1

This example demonstrates the processing conditions used to reduce the water vapor pressure and total pressure while maintaining a useful YBCO film growth rate.

A precursor film comprising Ba, Y, Cu and F was deposited in a vacuum deposition chamber at a rate of 100

Angstroms per second (Å/sec) in a vacuum of about $10^{-6}$ Torr. The $BaF_2$ was evaporated using a thermal source at a deposition rate of 50 Å/sec. The Y and Cu metals were evaporated using electron beam guns at deposition rates of 20 and 32 Å/sec, respectively. The precursor film was deposited onto a $SrTiO_3$ single crystal with an 001 face cut. The substrate was 3×10×1 millimeters in size and was not intentionally heated during the deposition. The resulting precursor film included microcrystalline $BaF_2$, Y and Cu, or possibly oxides of Y and Cu, as revealed by Transmission Electron Microscopy (TEM).

After the deposition was completed, the precursor film was removed from the vacuum deposition chamber. Silver contacts were attached to the film to measure the conductance of the precursor film during processing. The film was then inserted into the quartz tube 60 of the vacuum-processing furnace 10. A vacuum was created in the quartz tube 60 by a direct-drive, rotary-vane vacuum pump attached to said tube 60. Next a sub-atmosphere mixture of oxygen, nitrogen and water vapor was established in the quartz tube 60. The gas flows were as follows: 35 standard cubic centimeters per minute (sccm) of a 20% $O_2$-80% $N_2$ gas mixture and a 1 liter per minute of humidified $N_2$. The $N_2$ gas was humidified by bubbling the $N_2$ gas through liquid water prior to introduction into the quartz tube 60. The total absolute gas pressure in the quartz tube 60 was 15 Torr. The water vapor partial pressure was 0.4 Torr and the oxygen partial pressure was about 125 milliTorr. After the gaseous sub-atmosphere mixture was established in the quartz tube 60, the temperature of the oven 50 was ramped from room temperature to 735° C. at a rate of 1500° C./hr. The film was heat-treated at 735° C. for 1.5 hours. During heat-treating, the precursor film was converted into a crystalline YBCO film. The growth rate of the YBCO film, determined by in-situ measurements of the film conductance, was about 2.8 Å/sec. The final YBCO film thickness was 1 micron.

After the precursor film was converted to crystalline YBCO, the vacuum-processing furnace 10 temperature was reduced to 500° C. The YBCO film was annealed in pure oxygen at a pressure of about 600 Torr for one half hour. The vacuum-processing furnace 10 was then allowed to cool to room temperature. The YBCO film resistivity at room temperature, measured by the direct current 4 probe method was 290 $\mu$Ohm-cm. The YBCO film was removed from the quartz tube 60 and mounted in a test probe designed to measure electrical properties of the film. The critical current density, $J_c$, measured at 77 K was $0.9 \times 10^6$ Ampere per square centimeter (0.9 $MA/cm^2$) in zero magnetic field. The critical current density, $J_c$, measured at 77 K in a magnetic field of 1 Tesla was 0.18 $MA/cm^2$. The direction of the magnetic field was parallel to the c axis of the YBCO film or perpendicular to the surface of the film.

Figure 5:
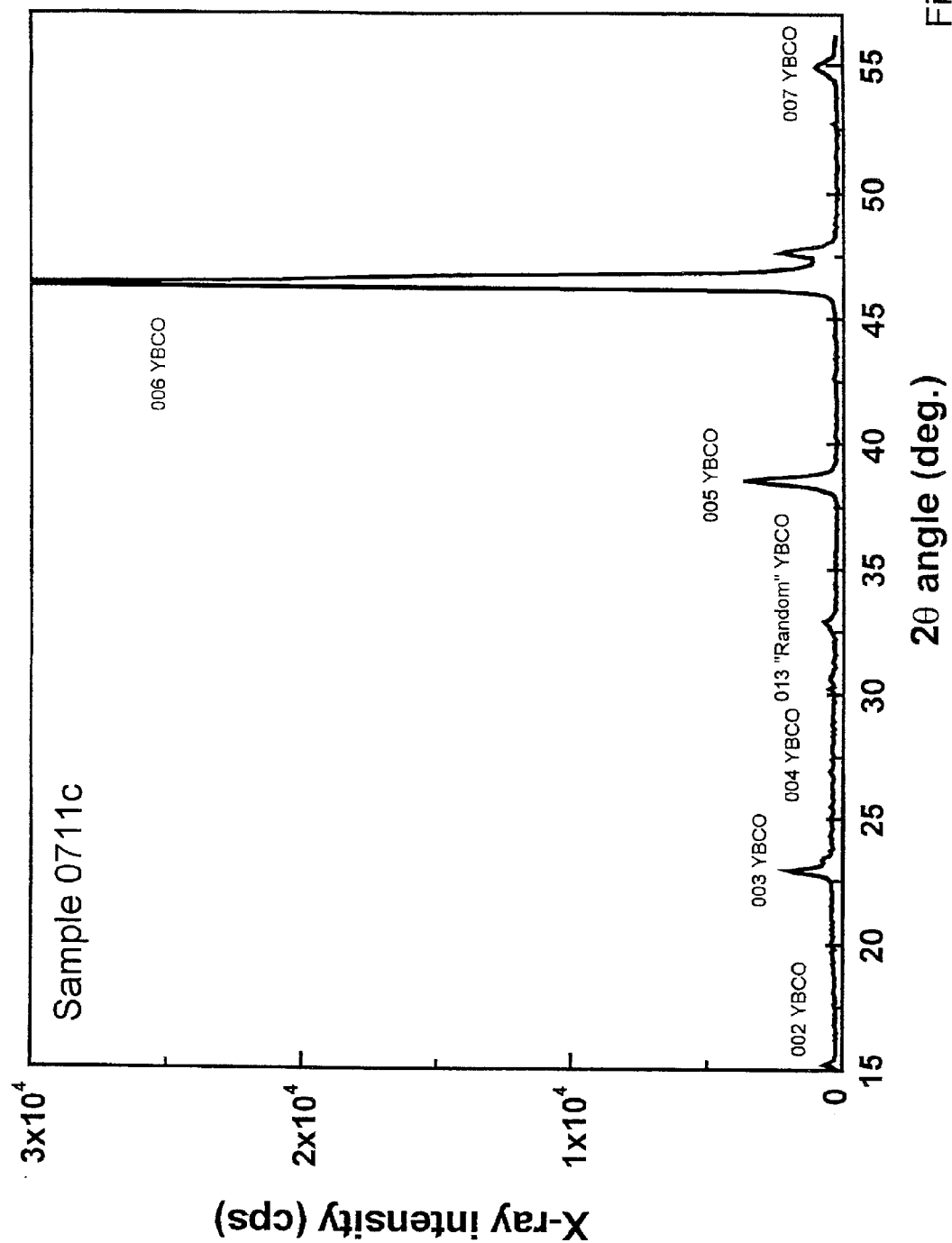
FIG. 5 is the theta-2theta x-ray diffraction scan for an YBCO film of the present invention.

In FIG. 5, labeled Sample 0812a, is shown a theta-2theta x-ray diffraction of the YBCO film. As is known to those skilled in the art, the x-ray diffraction scan demonstrates that the YBCO film is textured with respect to the $SrTiO_3$ substrate. The strong 001 reflections demonstrate that the YBCO film is oriented with the c-axis normal to the substrate plane. There is no evidence for the presence of second phases or randomly oriented grains. The small peak at 47.5 degrees indicates the presence of a minor amount of a-axis and/or b-axis grains normal to the substrate plane.

EXAMPLE 2

Example 2 demonstrates the processing conditions used to grow an YBCO film at a rate in excess of 15 Å/sec.

A precursor film comprising Ba, Y, Cu and F was formed in a vacuum deposition chamber in a vacuum of about $10^{-6}$ Torr. The $BaF_2$ was evaporated using a thermal source at a deposition rate of 50 Å/sec. The Y and Cu metals were evaporated using electron beam guns at deposition rates of 20 and 32 Å/sec respectively. The precursor film was deposited onto a $SrTiO_3$ single crystal substrate with a 001 face cut at a rate of 100 Å/sec. The substrate was 3×10×1 millimeters in size and was not intentionally heated during the deposition. The resulting film was comprised of microcrystalline $BaF_2$, Y and Cu, or possibly oxides of Y and Cu, as revealed by Transmission Electron Microscopy.

After the deposition was completed the precursor film was removed from the vacuum deposition chamber. Silver contacts were attached to the film to measure the conductivity of the precursor film during processing. The film was inserted into the quartz tube 60 of the vacuum-processing furnace 10 and a partial vacuum was created by a series combination of a liquid nitrogen cold trap and a direct-drive, rotary-vane vacuum pump. As is known to those skilled in the art, a direct-drive rotary vane pump has a limited capacity for pumping water vapor. Continuously pumping high concentrations of water vapor gradually results in the formation of an oil-water emulsion that decreases the water vapor pumping capability of the pump. The cold trap placed in series with the pump and nearer to the outlet 65 of the quartz tube 60. The cold trap condenses the water vapor to ice preventing the water vapor from reaching the pump. The oxygen and nitrogen gasses are unaffected by the cold trap. The precursor film was heat-treated in a sub-atmosphere mixture of oxygen, nitrogen and water vapor. The total gas pressure in the quartz tube was 18.5 Torr. This pressure consisted of 0.5 Torr of a 20% $O_2$-80% $N_2$ gas mixture and 18 Torr of water vapor. After the gaseous sub-atmosphere mixture was established in the quartz tube 60, the temperature of the oven 50 was ramped from room temperature to 735° C. at a rate of 1500° C./hr. The film was held at 735° C. for 1.5 hours. During heat-treating at 735° C. the precursor film was converted into a crystalline YBCO film. The growth rate of the YBCO film, determined by in-situ measurements of the film conductivity, was about 18 Å/sec. The final YBCO film thickness was 1 micron.

After the precursor film was converted to crystalline YBCO, the oven 50 temperature was reduced to 500° C. and the YBCO film was annealed in pure oxygen at a pressure of 600 Torr for 0.5 hours. The vacuum-processing furnace 10 was then allowed to cool to room temperature. The resistivity at room temperature of the YBCO film produced was about 600 $\mu$Ohm-cm. The YBCO film was removed from the quartz tube and mounted in a test probe designed to measure electrical properties of the film. The critical current density, $J_c$, measured at 77 K in a magnetic field of 1 Tesla was 0.01 $MA/cm^2$. The direction of the magnetic field was parallel to the c axis of the YBCO film or perpendicular to the surface of the film.

Figure 6:
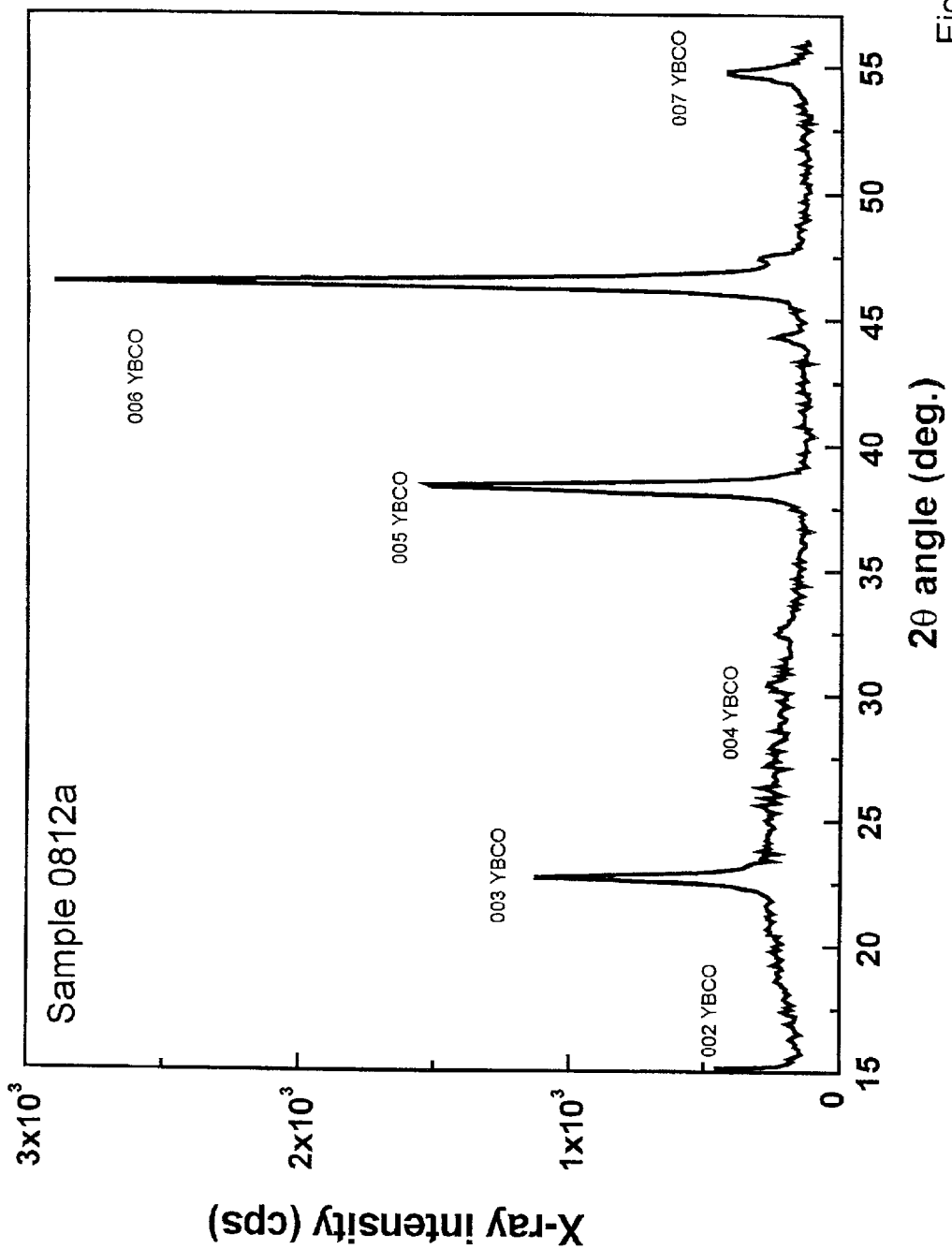
FIG. 6 is the theta-2theta x-ray diffraction scan for an YBCO film of the present invention.

In FIG. 6, labeled Sample 0711c, is shown a theta-2theta x-ray diffraction of the YBCO film. As is known to those skilled in the art, the x-ray diffraction scan demonstrates that the YBCO film is textured with respect to the $SrTiO_3$ substrate. The strong 001 reflections demonstrate that the YBCO film is oriented with the c-axis normal to the substrate plane. There is evidence for the slight presence of random YBCO grains as indicated by the peak at 33 degrees.

The small peak at 47.5 degrees indicates the presence of a minor amount of a-axis and/or b-axis grains normal to the substrate plane.

Gas Flow Dynamics

The growth of YBCO films at atmospheric pressure is dependent upon the gas flow dynamics of the gasses used during the heat-treating cycle. Gas flow dynamics are also important for YBCO films grown at sub-atmospheric pressures. It is understood by those skilled in the art that a reduction in processing pressure results in an increase in the diffusivity of the gasses present in the quartz tube of the vacuum-processing furnace 10. This increase in the rate of gas diffusion is especially beneficial for the uniform growth of large area films as compared to atmospheric pressure film growth. The heat treatment of precursor films at sub-atmospheric pressure allows the practitioner of this invention greater latitude in choosing combinations of processing variables necessary for achieving the desired film properties.

EXAMPLE 3

In Example 1 and Example 2 the precursor film 85 was heat-treated in a quartz tube 50 centimeters in diameter and 150 centimeters long as shown schematically in FIG. 3. In order to demonstrate the utility of the present invention Example 3 describes the growth of an YBCO film 85 wherein the vacuum-processing apparatus 15 was modified. It was desired to heat-treat a precursor film 85 at a water vapor pressure of 5 Torr and a total pressure of 21 Torr. Normally the YBCO growth rate in our vacuum-processing apparatus 15 for these sub-atmospheric pressure conditions would be in excess 10 Å/sec as indicated in FIG. 4. It was desired to lower the YBCO growth rate without appreciably altering the water vapor pressure of 5 Torr and the total pressure of 21 Torr. The vacuum-processing apparatus 15 was modified as follows; a container 70 was constructed and placed in the quartz tube 60 of the vacuum-processing apparatus 15. The container 70 is shown schematically in FIG. 7. The function of the container 70 was to increase the partial pressure of hydrogen fluoride (HF) at the surface of the growing YBCO film 85 compared to the partial pressure of HF in the interior of the quartz tube 60. The open "channel" 72 provides a path from the interior of the container 70 to the interior of the quartz tube 60 and causes impedance to the flow of gas emanating from the surface of the growing YBCO film 85 and flowing through the channel 72 to the interior of the quartz tube. It is understood by those skilled in the art that fluorine is removed from the precursor film 85 by reaction with water vapor. The fluorine exits the growing YBCO film 85 presumably as HF. The influence of the presence of hydrogen fluoride during the heat-treating cycle was first described by Chan et al. "Effect of the post-deposition processing ambient on the preparation of superconducting $YBa_2Cu_3O_{7-x}$ coevaporated thin films using a $BaF_2$ source", *Applied Physics Letters*, 53 (15), October 1988, incorporated by reference herein. Chan et al. argued that the rate of decomposition of $BaF_2$ by reaction with water vapor should be dependant upon the partial pressure of the hydrogen fluoride (HF) present in the quartz tube during the heat-treating cycle. Chan et al. argued that the YBCO growth rate is proportional to the rate of $BaF_2$ decomposition and increasing the HF partial pressure while heat-treating a precursor film 85 was expected to decrease the growth rate of the YBCO film 85.

A precursor film 85 comprising Ba, Y, Cu and F was formed on a single crystal $SrTiO_3$ substrate in a vacuum deposition chamber in a manner similar to the method described in Example 2. Silver leads were attached to the precursor film 85 and the film 85 was mounted in a container 70 constructed of quartz. The container 70 is shown schematically in FIG. 7. It was composed of a quartz box measuring 10 mm long by 10 mm wide by 2 mm high. An open "channel" 72 20 mm long by 10 mm wide by 1 mm high allowed the passage of gasses between the interior of the quartz box (container 70) and the interior of the quartz tube.

The precursor film-container 70 combination was inserted into the quartz tube 60 of the vacuum-processing furnace 10 and a vacuum was created using a combination of a liquid nitrogen cold trap and a direct drive rotary vane pump connected in series. The operation and purpose of the liquid nitrogen cold trap was described previously in Example 2. The precursor film 85 was processed in a sub-atmospheric mixture of oxygen, nitrogen and water vapor. The water vapor was injected into the quartz tube 60 by saturating nitrogen gas with water vapor and admitting the humidified nitrogen gas into the quartz tube 60. The nitrogen gas was saturated with water vapor by bubbling the nitrogen gas through liquid water. The flow rate of the humidified nitrogen gas was 250 sccm. A 20% $O_2$-80% $N_2$ gas mixture was also admitted to the quartz tube at a flow of 7 sccm. The oxygen partial pressure was about 100 milliTorr, the water vapor partial pressure was 5 Torr and the total gas pressure in the quartz tube was about 23 Torr. After the sub-atmospheric gas mixture was established in the quartz tube the temperature of the oven 50 was ramped from room temperature to 735° C. at a rate of 1500° C./hour. The film 85 was heat-treated at 735° C. for 1.5 hours. It is estimated by calculation that the HF pressure in the container 70 was about 10 milliTorr. The growth rate of the YBCO film 85, as determined from in-situ measurements of the film conductivity, was 2.5 Å/sec. The final YBCO thickness was 1 micron. Next the oven 50 temperature was reduced to 500° C. and the YBCO film 85 was annealed in pure oxygen at a pressure of 600 Torr for 0.5 hours. The vacuum-processing apparatus 15 was then allowed to cool to room temperature. The room temperature resistivity of the YBCO film 85 produced was about 211 $\mu$Ohm-cm. The container 70 was removed from the quartz tube and the YBCO film 85 was removed from the container 70 and mounted in a test probe designed to measure electrical properties of the film 85. The critical current density, $J_c$, measured at 77 K was $1.8 \times 10^6$ Ampere per square centimeter (1.8 $MA/cm^2$) in zero magnetic field. The critical current density, $J_c$, measured at 77 K in a magnetic field of 1 Tesla was $0.6 \times 10^6$ Ampere per square centimeter (0.6 $MA/cm^2$). The direction of the magnetic field was parallel to the c axis of the YBCO film 85 or perpendicular to the surface of the film 85.

Figure 8:
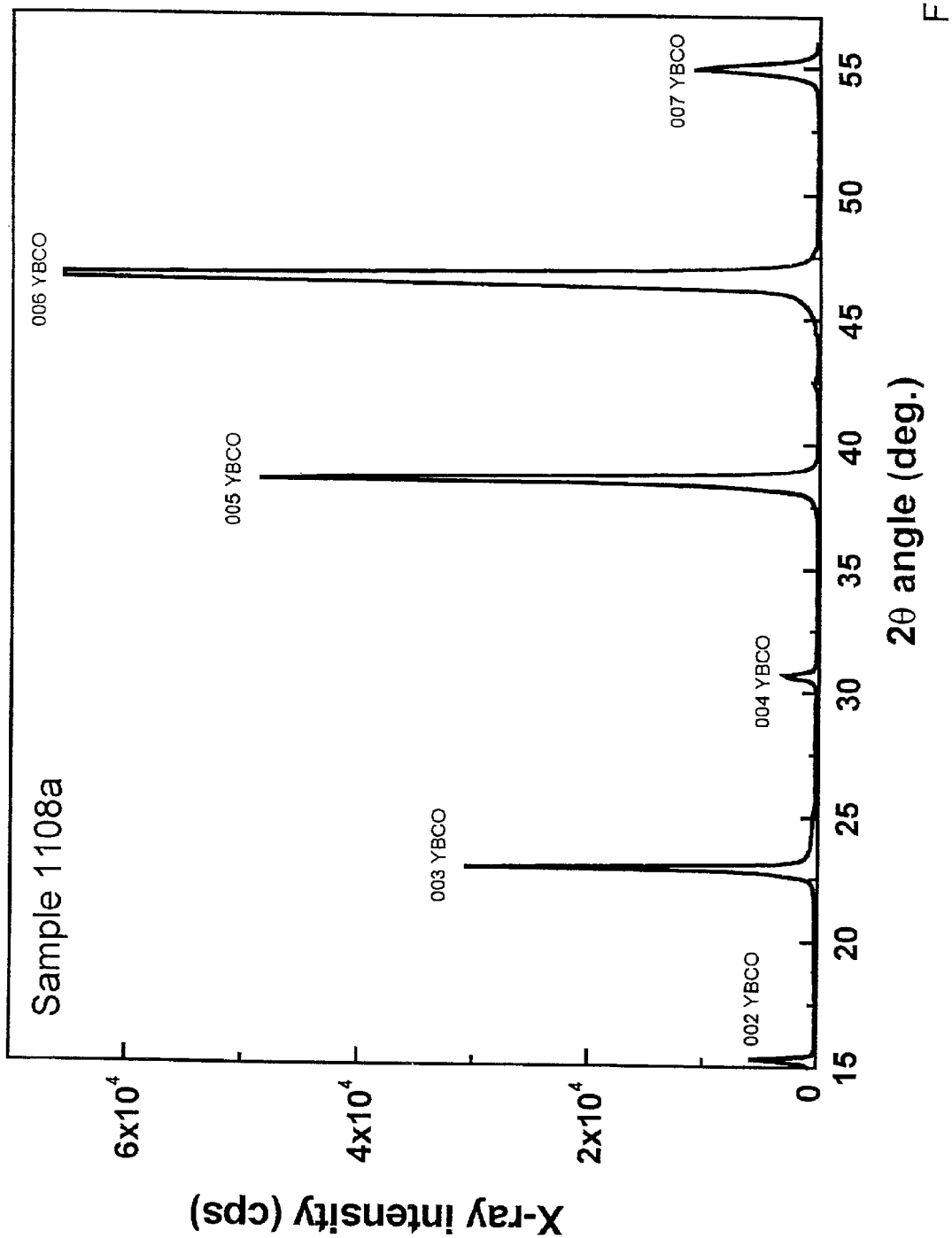
FIG. 8 is the theta-2theta x-ray diffraction scan for an YBCO film of the present invention.

In FIG. 8, labeled Sample 1108a, is shown a theta-2theta x-ray diffraction of the YBCO film 85. The x-ray diffraction scan demonstrates that the YBCO film 85 is textured with respect to the $SrTiO_3$ substrate. The strong 001 reflections demonstrate that the YBCO film 85 is oriented with the c-axis normal to the substrate plane. The x-ray diffraction scan is of high quality. There is no evidence for the presence of random YBCO grains as indicated by the absence of a diffraction peak at 33 degrees. There is no evidence for the presence of a-axis and/or b-axis grains normal to the substrate plane as indicated by the absence of a diffraction peak at 47.5 degrees. The x-ray diffraction of the YBCO film 85 of this example is consistent with the higher values of $J_c$ as compared to Examples 1 and 2 above. This example demonstrates that increasing the HF partial pressure at the surface of a growing YBCO film 85 is consistent with the growth of a crystalline YBCO film 85 with a very high value of $J_c$.

In the previous examples a "carrier gas", nitrogen, is used to transport water vapor into the vacuum-processing furnace 10. It is understood that the "carrier gas" also contributes to the total gas pressure, $P_T$.

Figure 7:
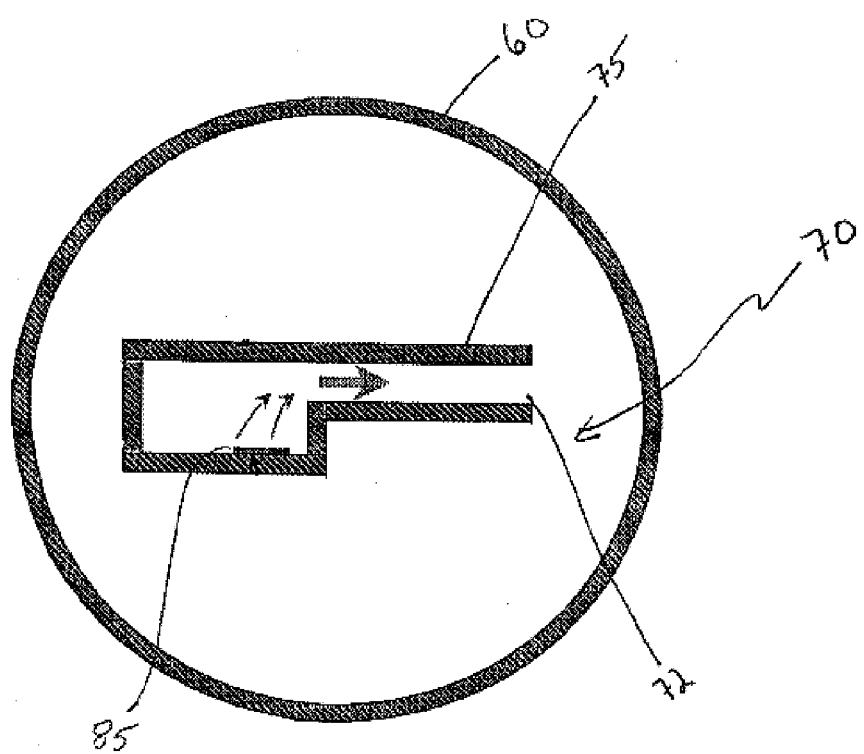
FIG. 7 is a schematic of a container used for heat-treating a precursor film.

In Example 3 the HF partial pressure in the interior of the container 70 was calculated to be about 10 milliTorr. This slight increase in HF pressure causes the total pressure in the interior of the container 70 to increase above the nominal value of 21 Torr but the total pressure in the interior of the container 70 does not exceed 21.01 Torr. In FIG. 7 the impedance to gas flow is provided by the presence of the open channel connecting the interior of the container 70 to the interior of the quartz tube. It is understood that impedance to the flow of gas can be achieved using different structures and geometries. For example an alternative container design can be achieved by replacing the open channel of FIG. 7 with a membrane permeable to the flow of gas. The geometry of the container 70 necessary to achieve the desired growth rate and YBCO properties can be determined by calculation or experiment.

Three different gasses, nitrogen, oxygen and water vapor were admitted to the vacuum-processing apparatus 15 in Examples 1, 2 and 3. It is understood that only water vapor and oxygen are required for successful sub-atmospheric growth of YBCO films. It is also understood that oxygen containing gasses such as, but not limited to, ozone, nitrous oxide and oxygen may be used alone or in combination during the heat-treating cycle. In addition to nitrogen other gasses such as, but not limited to, helium and neon can be used alone or in combination. It is understood by those skilled in the art that the heat-treating process variables will have to be adjusted to achieve the desired YBCO properties.

Precursor films are not limited to any particular method of fabrication when processed according to the method of this invention. It is appreciated by those skilled in the art that RF sputtering, DC sputtering, magnetron sputtering, thermal evaporation, electron beam evaporation, pulsed laser deposition (PLD), spin coating, screen printing, chemical vapor deposition (CVD), photo CVD, dip coating, spray coating and metal organic chemical vapor deposition (MOCVD) are all viable methods, alone or in combination, for fabricating precursor films.

X-ray diffraction scans of YBCO coated single crystal $SrTiO_3$ substrates were obtained using a 4-circle x-ray goniometer. Combinations of theta-2theta ($\theta$), omega ($\omega$) and phi ($\phi$) scans were employed. The diffraction scans confirmed that the YBCO film was heteroepitaxial with the single crystal $SrTiO_3$ substrates.

The method of the present invention was also used to process precursor films comprising barium (Ba), fluorine (F), yttrium (Y) and copper (Cu) deposited on coated flexible textured nickel tapes. The nickel tapes were coated with a tri-layer structure composed of cerium oxide-yttrium stabilized zirconia-cerium oxide. The nickel tapes were fabricated by the method known to those skilled in the art as "RABBITS" described in U.S. Pat. No. 5,741,377 and incorporated by reference herein. X-ray diffraction scans of the cerium oxide coated flexible textured nickel tapes were obtained using a 4-circle x-ray goniometer. The diffraction scans confirmed that the cerium oxide was heteroepitaxial with the textured flexible nickel tape. After heat-treating at sub-atmospheric pressure the precursor films were converted to crystalline YBCO films. X-ray diffraction scans of the resulting YBCO films were obtained using a 4-circle x-ray goniometer. Combinations of theta-2theta ($\theta$), omega ($\omega$) and phi ($\phi$) diffraction scans were employed. The diffraction scans confirmed that the crystalline YBCO films were heteroepitaxial with the cerium oxide.

EXAMPLE 4

Example 2 demonstrates the processing conditions used to grow an YBCO film on a flexible substrate.

A precursor film comprising Ba, Y, Cu and F was formed in a vacuum deposition chamber in a vacuum of about $10^{-6}$ Torr in the same manner as described in Example 1. The precursor film was deposited onto a flexible substrate. The flexible substrate was a composite structure consisting of, first a textured nickel base, which had deposited on the nickel base a first heteroepitaxial layer of cerium oxide ($CeO_2$), which had deposited on the $CeO_2$ a second heteroepitaxial layer of yttrium stabilized zirconia (YSZ), which had deposited on the YSZ a third heteroepitaxial layer of $CeO_2$.

After the deposition was completed the precursor film was removed from the vacuum deposition chamber. The precursor film was mounted in a container 70 similar to the container 70 shown in FIG. 7 and the precursor film-container 70 combination was inserted into the quartz tube of the vacuum-processing furnace 10. A partial vacuum was created by a series combination of a liquid nitrogen cold trap and a direct-drive, rotary-vane vacuum pump. The cold trap was placed in series with the pump and nearer to the outlet 65 of the quartz tube. The precursor film was heat-treated in a sub-atmosphere mixture of oxygen, nitrogen and water vapor. A 7 sccm flow of a 20% $O_2$-80% $N_2$ gas mixture was admitted to the quartz tube establishing an oxygen pressure of about 0.1 Torr and a nitrogen pressure of 0.4 Torr. The water vapor pressure was 22 Torr. The total gas pressure in the quartz tube was about 22.5 Torr. After the gaseous sub-atmosphere mixture was established in the quartz tube, the temperature of the oven 50 was ramped from room temperature to 735° C. at a rate of 1500° C./hr. The film was held at 735° C. for 4 hours. During heat-treating at 735° C. the precursor film was converted into a crystalline YBCO film. The final YBCO film thickness was 3 microns.

After the precursor film was converted to crystalline YBCO, the oven temperature was reduced to 500° C. and the YBCO film was annealed in pure oxygen at a pressure of 600 Torr for 0.5 hours. The vacuum-processing furnace 10 was then allowed to cool to room temperature. The YBCO film was removed from the quartz tube and mounted in a test probe designed to measure electrical properties of the film. The critical current density, $J_c$, measured at 77 K was 0.6 $MA/cm^2$.

The method of the present invention is especially applicable to precursor films made by the method of metal organic deposition (MOD) and variants of MOD. The MOD process is described by Smith et al. in an article "High Critical Current Density Thick MOD-Derived YBCO Films", *IEEE Transactions on Applied Superconductivity*, 9 (2), June 1999, incorporated by reference herein. The first step in the MOD process is to prepare a liquid solution, for example a mixture of Y, Ba, and Cu trifluoroacetates in methanol. The trifluoroacetate is prepared by reacting Y, Ba and Cu acetates with trifluoroacetic acid in water. The Y, Ba and Cu acetates are mixed in the approximate molar ratio of 1:2:3. After drying the liquid mixture, the residue is dissolved in an appropriate carrier liquid, such as methanol. In order to form a precursor film the substrates are coated with the methanol based trifluoroacetate solution and allowed to dry. The organic components of the precursor film are 'burned off' at about 400° C. leaving a film of metal oxyfluorides. Using the method of the present invention the film-substrate composite is next heat-treated at sub-atmospheric pressure in a humidified, oxygen containing atmosphere, converting the oxyfluoride film to a crystalline YBCO film.

In addition to $YBa_2Cu_3O_7$ the method of the present invention can be used to fabricate other crystalline superconducting films chosen from the family $REBa_2Cu_3O_7$ where RE is a rare earth chosen from the group lanthanum (La), cerium (Ce), praseodymium (Pr), neodymium (Nd), samarium (Sm), europium (Eu), gadolinium (Gd), ), terbium (Tb), dysprosium (Dy), ), holmium (Ho), erbium (Er), thulium (Tm), ytterbium (Yb). Especially interesting is the fabrication of $NdBa_2Cu_3O_7$ ("NdBCO") films.

Thus, while there have been described the preferred embodiments of the present invention, those skilled in the art will realize that other embodiments can be made without departing from the spirit of the invention, and it is intended to include all such further modifications and changes as come within the true scope of the claims set forth herein.

What is claimed is:

1. A method of forming a film of crystalline YBa2Cu3O7 comprising:

forming a precursor film comprising barium (Ba), fluorine (F), yttrium (Y) and copper (Cu);

heat-treating said precursor film at a temperature above about 500° C. in the presence of oxygen and water vapor at sub-atmospheric pressure to form a crystalline structure; and annealing said crystalline structure in the presence of oxygen.

2. The method according to claim 1 wherein said precursor film is formed on a substrate.

3. The method according to claim 2, wherein said substrate is a ceramic or a metal, alone or in combination.

4. The method according to claim 3, wherein said substrate is $SrTiO_3$.

5. The method according to claim 3, wherein said substrate is $CeO_2$.

6. The method according to claim 3, wherein said substrate is chosen from the group MgO, $LaAlO_3$, Yttrium Stabilized Zirconia, $ZrO_2$.

7. The method according to claim 3, wherein said substrate is chosen from the group Nickel, Ag, alloys comprising Nickel, alloys comprising Ag.

8. The method according to claim 2 wherein said substrate is substantially single crystal.

9. The method according to claim 1 wherein said heat-treating temperature is from about 500° C. to about 1000° C.

10. The method according to claim 1 wherein said heat-treating atmosphere comprises oxygen and water vapor and additional gas chosen, alone or in combination, from the group nitrogen, argon or helium.

11. The method according to claim 1 wherein said oxygen pressure during heat-treating is about 100 milliTorr.

12. The method according to claim 1 wherein said $YBa_2Cu_3O_7$ film has a resistivity of from about 100 to about 600 $\mu$Ohm-cm at room temperature.

13. The method according to claim 1 wherein said $YBa_2Cu_3O_7$ film has a critical current density measured at 77 K in a magnetic field of 1 Tesla of from about 0.01 $MA/cm^2$ or greater.

14. The method according to claim 1 wherein during said heat-treating said $YBa_2Cu_3O_7$ film grows at a rate of from about 1 to about 20 Angstroms per second.

15. The method according to claim 1, wherein said $YBa_2Cu_3O_7$ film has a thickness of from about 0.5 to about 10 microns.

16. The method according to claim 1, wherein said $YBa_2Cu_3O_7$ film has a critical current density measured at 77 K of from about 0.1 $MA/cm^2$ or greater in zero magnetic field.

17. The method according to claim 1, wherein said precursor film is formed on a substrate comprising $SrTiO_3$.

18. The method according to claim 1 wherein said precursor film is formed, alone or in combination, by RF sputtering, DC sputtering, magnetron sputtering, thermal evaporation, electron beam evaporation, pulsed laser deposition, physical vapor deposition, metal organic deposition, spin coating, screen printing, spray coating, dip coating, chemical vapor deposition, metal organic chemical vapor deposition, plasma spraying.

19. The method according to claim 1, wherein said crystalline structure is annealed at a temperature of from about 400° C. to about 650° C.

20. The method according to claim 1 wherein said oxygen gas is chosen from the group nitrous oxide, ozone, oxygen alone or in combination.

21. The method according to claim 1 wherein said precursor film is enclosed in a first container: the interior of said first container at sub-atmospheric pressure; where said first container is enclosed in a second container; said first container connected to said second container by a permeable structure; the interior of said second container at sub-atmospheric pressure.

22. The method according to claim 21 wherein said alkaline earth element is chosen, alone or in combination, from the group magnesium (Mg), calcium (Ca), strontium (Sr), barium (Ba).

23. The method according to claim 21 wherein said rare earth element is chosen, alone or in combination, from the group lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb).

24. A method of forming a film of crystalline (Rare Earth)$Ba_2Cu_3O_7$ comprising:

forming a precursor film comprising barium (Ba), fluorine (F), yttrium (Y), copper (Cu) and rare earth element chosen, alone or in combination, from the group lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb);

heat-treating said precursor film at a temperature above about 500° C. in the presence of oxygen and water vapor at sub-atmospheric pressure to form a crystalline structure; and annealing said crystalline structure in the presence of oxygen.

25. The method according claim 24, wherein said precursor film is formed on a substrate.

26. A method of forming a film of crystalline superconductor of the approximate composition (Rare Earth)$_1$ (Alkaline Earth)$_2$ $Cu_3$ $O_7$ comprising:

forming a precursor film comprising at least one rare earth element, at least one alkaline earth element, fluorine (F), and copper (Cu);

heat-treating said precursor film at a temperature above about 500° C. in the presence of oxygen and water vapor at sub-atmospheric pressure to form a crystalline structure; and annealing said crystalline structure in the presence of oxygen.

* * * * *